(12) United States Patent
Hareyama

(10) Patent No.: US 10,187,971 B2
(45) Date of Patent: Jan. 22, 2019

(54) WIRING BOARD AND METHOD OF MANUFACTURING WIRING BOARD

(71) Applicant: Sony Corporation, Tokyo (JP)

(72) Inventor: Kosuke Hareyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 30 days.

(21) Appl. No.: 14/422,992

(22) PCT Filed: Aug. 16, 2013

(86) PCT No.: PCT/JP2013/072020
§ 371 (c)(1),
(2) Date: Feb. 20, 2015

(87) PCT Pub. No.: WO2014/034443
PCT Pub. Date: Mar. 6, 2014

(65) Prior Publication Data
US 2015/0230329 A1 Aug. 13, 2015

(30) Foreign Application Priority Data
Aug. 31, 2012 (JP) ................................. 2012-191377

(51) Int. Cl.
*H05K 1/02* (2006.01)
*H05K 3/46* (2006.01)
(Continued)

(52) U.S. Cl.
CPC ......... *H05K 1/0216* (2013.01); *H05K 1/0222* (2013.01); *H05K 1/0298* (2013.01);
(Continued)

(58) Field of Classification Search
CPC .... H05K 1/0216; H05K 3/4644; H05K 1/116; H05K 1/0222; H05K 1/0251;
(Continued)

(56) References Cited

U.S. PATENT DOCUMENTS 6,937,120 B2 * 8/2005 Fisher ..................... H01P 1/047
174/266
7,149,092 B2 * 12/2006 Iguchi .................. H05K 1/0222
174/260

(Continued)

FOREIGN PATENT DOCUMENTS

CN 101142860 A 3/2008
CN 101313439 A 11/2008

(Continued)

OTHER PUBLICATIONS

International Search Report issued in connection with International Patent Application No. PCT/JP2013/072020, dated Sep. 24, 2013. (2 pages).

(Continued)

*Primary Examiner* — Nathan Milakovich
(74) *Attorney, Agent, or Firm* — Chip Law Group

(57) ABSTRACT

A wiring board that includes: insulation layers and wiring layers which are laminated alternately; a component connection pad present on one surface of the wiring board in a lamination direction of the insulation layers and the wiring layers, and to which an electronic component is connected; a circuit connection pad present on another surface of the wiring board in the lamination direction and is connected to a circuit board; and a structure which includes a coaxial structure, wherein each of the wiring layers is connected by a via, and the coaxial structure includes an inner wiring part extending in the lamination direction and an outer wiring part located on a side corresponding to an outer peripheral surface of the inner wiring part through an insulating resin, and the inner wiring part is electrically connected to the component connection pad and the circuit connection pad.

11 Claims, 7 Drawing Sheets

(51) Int. Cl.
*H05K 1/11* (2006.01)
*H05K 1/03* (2006.01)
*H05K 1/18* (2006.01)

(52) U.S. Cl.
CPC ............. *H05K 1/032* (2013.01); *H05K 1/111* (2013.01); *H05K 1/115* (2013.01); *H05K 1/116* (2013.01); *H05K 1/181* (2013.01); *H05K 3/4644* (2013.01); *H05K 3/4682* (2013.01); *H05K 1/0251* (2013.01); *H05K 1/113* (2013.01); *H05K 2201/0195* (2013.01); *H05K 2201/09809* (2013.01); *Y10T 156/1056* (2015.01)

(58) Field of Classification Search
CPC ...... H05K 1/111; H05K 1/0298; H05K 1/115; H05K 1/181; H05K 1/032; H05K 3/4682; Y10T 156/1056
See application file for complete search history.

(56) References Cited

U.S. PATENT DOCUMENTS

| | | | | |
|---|---|---|---|---|
| 7,408,120 | B2* | 8/2008 | Kim | H05K 1/115 |
| | | | | 174/260 |
| 7,485,489 | B2* | 2/2009 | Bjorbell | H01L 23/5385 |
| | | | | 257/790 |
| 7,679,006 | B2* | 3/2010 | Nakamura | H05K 1/0251 |
| | | | | 174/262 |
| 8,151,456 | B2* | 4/2012 | Maehara | H05K 1/115 |
| | | | | 174/255 |
| 8,354,601 | B2* | 1/2013 | Russell | H05K 1/0222 |
| | | | | 174/262 |
| 8,586,875 | B2* | 11/2013 | Morita | H05K 1/0222 |
| | | | | 172/262 |
| 9,041,208 | B2* | 5/2015 | Gallegos | H05K 1/0222 |
| | | | | 257/774 |
| 2006/0288574 | A1 | 12/2006 | Oggioni et al. | |
| 2007/0124924 | A1 | 6/2007 | Nakamura | |
| 2007/0230150 | A1* | 10/2007 | Castriotta | H01L 23/49827 |
| | | | | 361/794 |
| 2008/0149384 | A1 | 6/2008 | Kawabe | |
| 2009/0200682 | A1 | 8/2009 | Zhang | |
| 2011/0203842 | A1 | 8/2011 | Russell | |
| 2011/0209911 | A1 | 9/2011 | Ishida et al. | |
| 2012/0180312 | A1* | 7/2012 | Zhang | H05K 1/024 |
| | | | | 29/846 |
| 2015/0014045 | A1* | 1/2015 | Brigham | H05K 1/116 |
| | | | | 174/266 |

FOREIGN PATENT DOCUMENTS

| | | |
|---|---|---|
| JP | 60-010286 Y2 | 4/1985 |
| JP | 62-230091 A | 10/1987 |
| JP | 62-230981 A | 10/1987 |
| JP | 01-045123 Y2 | 12/1989 |
| JP | 2001-308479 | 11/2001 |
| JP | 2002-026171 | 1/2002 |
| JP | 2002-204074 | 7/2002 |
| JP | 2003-133801 A | 5/2003 |
| JP | 2007-158174 | 6/2007 |
| JP | 2007-158174 A | 6/2007 |
| JP | 2008-177554 | 7/2008 |
| JP | 2008-177554 A | 7/2008 |
| JP | 2010-161419 | 7/2010 |
| JP | 2010-166099 | 7/2010 |
| JP | 2010-166099 A | 7/2010 |
| WO | 2004/094314 A2 | 11/2004 |
| WO | 2006/100764 A1 | 9/2006 |
| WO | 2011/018938 A1 | 2/2011 |

OTHER PUBLICATIONS

Office Action for CN Patent Application No. 201380043943.6, dated Mar. 15, 2017, 11 pages of Office Action and 12 pages of English Translation.

Office Action for CN Patent Application No. 201380043943.6, dated Nov. 13, 2017, 10 pages of Office Action and 11 pages of English Translation.

Office Action for JP Patent Application No. 2014-532922, dated Jul. 4, 2017, 06 pages of Office Action and 06 pages of English Translation.

* cited by examiner

WIRING BOARD AND METHOD OF MANUFACTURING WIRING BOARD

CROSS REFERENCES TO RELATED APPLICATIONS

The present application is a national stage of International Application No. PCT/JP2013/072020 filed on Aug. 16, 2013 and claims priority to Japanese Patent Application No. 2012-191377 filed on Aug. 31, 2012, the disclosure of which is incorporated herein by reference.

BACKGROUND

The present technology relates to a wiring board and a method of manufacturing a wiring board. Specifically, the present technology relates to a technical field which improves accuracy of control related to an impedance and mitigates a transmission loss of a signal with the provision of a coaxial structure having an inner wiring part and an outer wiring part located on the outer peripheral surface side of the inner wiring part.

An electronic component (an IC (Integrated Circuit) chip) used as a microprocessor or the like of a computer or a mobile phone has been getting faster and realizing a higher function in recent years, accompanied by the increased number of terminals and a narrowing pitch between the terminals. Usually, a number of terminal parts are provided in an array form on the bottom surface of the IC chip.

A pitch between the terminal parts of such IC chip is largely different from that of a connection terminal formed on a circuit board called a motherboard, making it difficult for the IC chip to be mounted to the motherboard.

Now, in order to connect the IC chip to the motherboard, it has been adapted to form a structure referred to as a semiconductor package including a wiring board and an IC chip mounted to the wiring board, mount (connect) the wiring board to the motherboard, and connect the IC chip to the motherboard via the wiring board.

The aforementioned wiring board can be a so-called coreless wiring board which is formed of a laminate of a plurality of insulation layers and a plurality of wiring layers formed by a build-up method and does not have a core layer (core substrate) (refer to Patent Documents 1 and 2, for example). The core substrate is omitted from such coreless wiring board so that the total wire length can be reduced, the transmission loss of a high-frequency signal can be mitigated, and the IC chip can be operated at high speed.

Each wiring layer of the aforementioned wiring board is connected by a via and provided with a plurality of lands connected to the via.

CITATION LIST

Patent Document

Patent Document 1: JP 2002-26171 A
Patent Document 2: JP 2010-161419 A

SUMMARY

Problems to be Solved by the Invention

The aforementioned semiconductor package is required to be provided in smaller size and higher density as well as operate faster and, accompanying these requirements, it is required to decrease a parasitic inductance and improve the accuracy of control related to an impedance of a signal line.

Now, the diameter of the land connected to the via of the aforementioned wiring board is formed in a size large enough to allow the via to be properly connected to the land even when the via is shifted during the processing, whereby it is difficult to form each land connected to each of both ends of the via at a fixed interval.

As a result, there occurs a problem of a transmission loss of a signal since a structure such as a coaxial structure, a strip line, or a microstrip line cannot be provided in connecting each wiring layer in order for the transmission characteristic of a signal to be improved.

Accordingly, an object of the wiring board and the method of manufacturing a wiring board of the present technology is to overcome the aforementioned problems to improve the accuracy of control related to the impedance and mitigate the transmission loss of a signal.

Solutions to Problems

First, in order to solve the aforementioned problems, a wiring board includes: a plurality of insulation layers and a plurality of wiring layers which are laminated alternately; a component connection pad which is provided on one surface of the wiring board in a lamination direction of the insulation layers and the wiring layers, and to which an electronic component is connected; a circuit connection pad which is provided on another surface of the wiring board in the lamination direction and is connected to a circuit board; and a structure forming part which partly includes a coaxial structure, wherein each of the wiring layers is connected by a via, the coaxial structure includes an inner wiring part extending in the lamination direction and an outer wiring part located on a side corresponding to an outer peripheral surface of the inner wiring part through an insulating resin, and the inner wiring part is electrically connected to the component connection pad and the circuit connection pad.

Therefore, the wiring board is provided with the coaxial structure including the inner wiring part, both ends of which are electrically connected to each of the circuit connection pad and the component connection pad, and the outer wiring part which is located on the side corresponding to the outer peripheral surface of the inner wiring part through the insulating resin.

Secondly, it is desired that both ends of the inner wiring part in the lamination direction of the aforementioned wiring board be joined to each of the component connection pad and the circuit connection pad.

The coaxial structure has the maximum size with respect to the thickness of the wiring board when both ends of the inner wiring part in the lamination direction are joined to each of the component connection pad and the circuit connection pad.

Thirdly, it is desired in the aforementioned wiring board that one end of the inner wiring part in the lamination direction be joined to one of the component connection pad and the circuit connection pad while another end of the inner wiring part in the lamination direction be connected to another one of the component connection pad and the circuit connection pad through the wiring layer and the via.

The coaxial structure is formed according to various modes having different layer structures when the one end of the inner wiring part in the lamination direction is joined to the one of the component connection pad and the circuit connection pad while the other end of the inner wiring part in the lamination direction is connected to the other one of the component connection pad and the circuit connection pad through the wiring layer and the via.

Fourthly, it is desired in the aforementioned wiring board that an outer diameter of the inner wiring part be 30 μm or larger and 80 μm or smaller while an inner diameter of the outer wiring part be 130 μm or larger and 350 μm or smaller.

A value appropriate for performing sufficient impedance control is secured when the outer diameter of the inner wiring part is 30 μm or larger and 80 μm or smaller while the inner diameter of the outer wiring part is 130 μm or larger and 350 μm or smaller.

First, in order to solve the aforementioned problems, a method of manufacturing a wiring board includes: a lamination process of laminating a plurality of insulation layers and a plurality of wiring layers on a support, at least a supporting surface of which against the board is formed of metal (hereinafter referred to as a "support"); a first through hole formation process of forming a structure forming through hole to partly provide a coaxial structure; an outer wiring part formation process of forming an outer wiring part which configures a part of the coaxial structure inside the structure through hole; a resin filling process of filling at least the structure forming through hole with resin; a second through hole formation process of forming an inner wiring through hole provided to form, in the resin filling the structure forming through hole, an inner wiring part which configures a part of the coaxial structure while electrically connected to a component connection pad, to which an electronic component is connected, and a circuit connection pad connected to a circuit board; and an inner wiring part formation process of forming the inner wiring part by filling the inner wiring through hole with a conductive material.

Therefore, in the method of manufacturing a wiring board, there is provided the coaxial structure including the inner wiring part, both ends of which are electrically connected to each of the circuit connection pad and the component connection pad, and the outer wiring part which is located on aside corresponding to an outer peripheral surface of the inner wiring part through an insulating resin.

Secondly, it is desired in the aforementioned method of manufacturing a wiring board that the structure forming through hole be formed by irradiation with a laser beam.

The structure forming through hole is formed by the irradiation with the laser beam so that the support is not drilled by the laser beam.

Thirdly, it is desired in the aforementioned method of manufacturing a wiring board that the inner wiring part forming through hole be formed by irradiation with a laser beam.

The inner wiring part forming through hole is formed by the irradiation with the laser beam so that the connection pad is not drilled by the laser beam.

Fourthly, it is desired in the aforementioned method of manufacturing a wiring board that the component connection pad to which the electronic component is connected be provided on one surface of the board in a lamination direction of the insulation layer and the wiring layer, the circuit connection pad connected to a circuit board be provided on another surface of the board in the lamination direction, and both ends of the inner wiring part in the lamination direction be joined to each of the component connection pad and the circuit connection pad.

The coaxial structure has the maximum size with respect to the thickness of the wiring board when both ends of the inner wiring part in the lamination direction are joined to each of the component connection pad and the circuit connection pad.

Fifthly, it is desired in the aforementioned method of manufacturing a wiring board that the component connection pad to which the electronic component is connected be provided on one surface of the board in the lamination direction, the circuit connection pad connected to the circuit board be provided on another surface of the board in the lamination direction, one end of the inner wiring part in the lamination direction be joined to one of the component connection pad and the circuit connection pad, and another end of the inner wiring part in the lamination direction be connected to another one of the component connection pad and the circuit connection pad through the wiring layer and the via.

The coaxial structure is formed according to various modes having different layer structures when the one end of the inner wiring part in the lamination direction is joined to the one of the component connection pad and the circuit connection pad while the other end of the inner wiring part in the lamination direction is connected to the other one of the component connection pad and the circuit connection pad through the wiring layer and the via.

Sixthly, it is desired in the aforementioned method of manufacturing a wiring board that an outer diameter of the inner wiring part be 30 μm or larger and 80 μm or smaller while an inner diameter of the outer wiring part be 130 μm or larger and 350 μm or smaller.

A value appropriate for performing sufficient impedance control is secured when the outer diameter of the inner wiring part is 30 μm or larger and 80 μm or smaller while the inner diameter of the outer wiring part is 130 μm or larger and 350 μm or smaller.

Effects of the Invention

The wiring board according to the present technology includes: the plurality of insulation layers and the plurality of wiring layers which are laminated alternately; the component connection pad which is provided on the one surface of the wiring board in the lamination direction of the insulation layers and the wiring layers, and to which the electronic component is connected; the circuit connection pad which is provided on the other surface of the wiring board in the lamination direction and is connected to the circuit board; and the structure forming part which partly includes the coaxial structure, wherein each of the wiring layers is connected by the via, the coaxial structure includes the inner wiring part extending in the lamination direction and the outer wiring part located on the side corresponding to the outer peripheral surface of the inner wiring part through the insulating resin, and the inner wiring part is electrically connected to the component connection pad and the circuit connection pad.

As a result, the accuracy of control related to the impedance is improved by the coaxial structure so that the transmission loss of a signal can be mitigated upon securing the smaller size and higher density of the wiring board as well as the higher speed of operation.

According to the technology described in claim 2, both ends of the inner wiring part in the lamination direction are joined to each of the component connection pad and the circuit connection pad.

As a result, the coaxial structure has the maximum size with respect to the thickness of the wiring board so that sufficient impedance control can be exerted.

According to the technology described in claim 3, the one end of the inner wiring part in the lamination direction is joined to the one of the component connection pad and the circuit connection pad while the other end of the inner wiring part in the lamination direction is connected to the other one of the component connection pad and the circuit connection pad through the wiring layer and the via.

As a result, the coaxial structure according to various modes having different layer structures can be formed to realize increased versatility.

According to the technology described in claim 4, the outer diameter of the inner wiring part is 30 μm or larger and 80 μm or smaller while the inner diameter of the outer wiring part is 130 μm or larger and 350 μm or smaller.

As a result, a value appropriate for performing sufficient impedance control is secured so that the impedance control can be performed satisfactorily on the wiring board even when there is a dimensional error in a design value caused by variation in position accuracy and processing accuracy of each part.

The method of manufacturing a wiring board according to the present technology includes: the lamination process of laminating the plurality of insulation layers and the plurality of wiring layers on the support; the first through hole formation process of forming the structure forming through hole to partly provide the coaxial structure; the outer wiring part formation process of forming the outer wiring part which configures a part of the coaxial structure inside the structure through hole; the resin filling process of filling at least the structure forming through hole with resin; the second through hole formation process of forming the inner wiring through hole provided to form, in the resin filling the structure forming through hole, the inner wiring part which configures apart of the coaxial structure while electrically connected to the component connection pad, to which the electronic component is connected, and the circuit connection pad connected to the circuit board; and the inner wiring part formation process of forming the inner wiring part by filling the inner wiring through hole with the conductive material.

As a result, the accuracy of control related to the impedance is improved by the coaxial structure so that the transmission loss of a signal can be mitigated upon securing the smaller size and higher density of the wiring board as well as the higher speed of operation.

According to the technology described in claim 6, the structure forming through hole is formed by the irradiation with the laser beam.

As a result, the surface of the support is not drilled so that damage to the support can be prevented and that the structure forming through hole can be formed appropriately.

According to the technology described in claim 7, the inner wiring part forming through hole is formed by the irradiation with the laser beam.

As a result, the surface of the connection pad is not drilled so that damage to the connection pad can be prevented and that the structure forming through hole can be formed appropriately.

According to the technology described in claim 8, the component connection pad to which the electronic component is connected is provided on the one surface of the board in the lamination direction of the insulation layer and the wiring layer, the circuit connection pad connected to the circuit board is provided on the other surface of the board in the lamination direction, and both ends of the inner wiring part in the lamination direction are joined to each of the component connection pad and the circuit connection pad.

As a result, the coaxial structure has the maximum size with respect to the thickness of the wiring board so that sufficient impedance control can be exerted.

According to the technology described in claim 9, the component connection pad to which the electronic component is connected is provided on the one surface of the board in the lamination direction, the circuit connection pad connected to the circuit board is provided on the other surface of the board in the lamination direction, the one end of the inner wiring part in the lamination direction is joined to the one of the component connection pad and the circuit connection pad, and the other end of the inner wiring part in the lamination direction is connected to the other one of the component connection pad and the circuit connection pad through the wiring layer and the via.

As a result, the coaxial structure according to various modes having different layer structures can be formed to realize increased versatility.

According to the technology described in claim 10, the outer diameter of the inner wiring part is 30 μm or larger and 80 μm or smaller while the inner diameter of the outer wiring part is 130 μm or larger and 350 μm or smaller.

As a result, a value appropriate for performing sufficient impedance control is secured so that the impedance control can be performed satisfactorily on the wiring board even when there is a dimensional error in a design value caused by variation in position accuracy and processing accuracy of each part.

Additional features and advantages are described herein, and will be apparent from the following Detailed Description and the figures.

DETAILED DESCRIPTION

The best modes for carrying out a wiring board and a method of manufacturing a wiring board according to the present technology will now be described with reference to the drawings.

The wiring board illustrated below is a wiring board referred to as a coreless board which is provided as a part of a structure called a semiconductor package including an electronic component and a heat dissipation plate and does not include a core layer (core substrate).

In the following description, a lamination direction of each part of the wiring board corresponds to a vertical direction where front and back, vertical, and right and left directions are indicated accordingly.

Note that the front and back, vertical, and right and left directions indicated below are provided for the convenience of description, and the present technology in its implementation is not limited to these directions.

[Configuration of Wiring Board]

Figure 1:
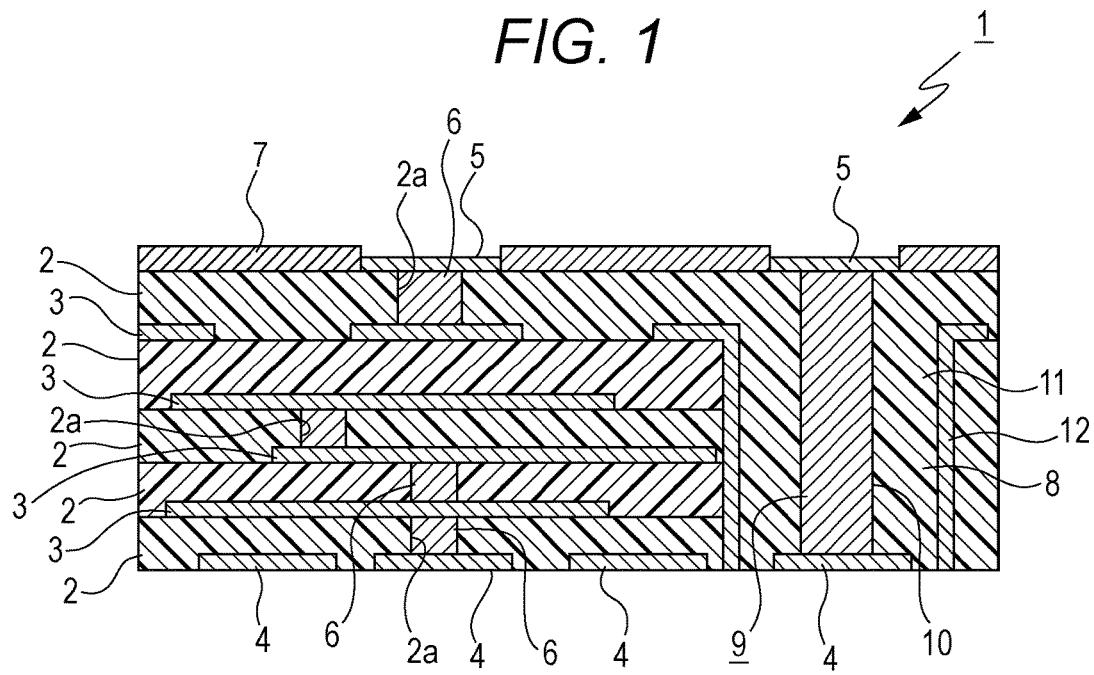
FIG. 1 illustrates, along with FIGS. 2 to 12, the best mode of a wiring board and a method of manufacturing a wiring board according to the present technology, and is an enlarged cross sectional view of the wiring board.

The configuration of a wiring board 1 will be described below (refer to FIG. 1).

The wiring board 1 is a coreless board not including a core layer and includes a plurality of insulation layers 2 and a plurality of wiring layers 3 that are laminated alternately. The insulation layer 2 is made of an epoxy resin, for example, while the wiring layer 3 is made of copper, silver, or nickel, for example. The wiring layers 3 are connected by a predetermined path from a top layer to a bottom layer.

Component connection pads 4 are formed on a bottom surface (one surface) of the wiring board 1, namely on a bottom surface of the lowermost insulation layer 2. The component connection pads 4 are connected to a terminal part of an electronic component that is to be described later.

Circuit connection pads 5 are formed on a top surface (another surface) of the wiring board 1, namely on a top surface of the uppermost insulation layer 2. The circuit connection pads 5 are connected to a connection terminal of a circuit board (motherboard) that is to be described later.

Via holes 2a are formed in the insulation layers 2. The via hole 2a is formed by irradiating the insulation layer 2 with a YAG (Yttrium Aluminum Garnet) laser or a carbon dioxide laser, for example.

Each of the via holes 2a is filled with a conductive material to form each of vias 6. The wiring layers 3 are connected by the vias 6, which also connect between the wiring layer 3 and the component connection pads 4 and between the wiring layer 3 and the circuit connection pads 5.

A solder resist 7 is formed on a part of the top surface of the uppermost insulation layer 2 where the circuit connection pads 5 are not formed.

A part of the wiring board 1 where the insulation layers 2 and the wiring layers 3 are not provided is provided as a structure forming part 8. A coaxial structure 9 is provided in the structure forming part 8. The coaxial structure 9 includes an inner wiring part 10 and an outer wiring part 12 that is located on the outer peripheral side of the inner wiring part 10 through an insulating resin 11.

The inner wiring part 10 made of a conductive material such as copper, silver, or nickel is formed into a cylindrical shape and provided at the center of the structure forming part 8. The inner wiring part 10 extends in a vertical direction so that upper and lower ends thereof are joined to the circuit connection pad 5 and the component connection pad 4, respectively, and thus functions as a transmission path of an electrical signal.

The outer wiring part 12 made of a conductive material such as copper, silver, or nickel is formed into a cylindrical shape where a central axis thereof corresponds with a central axis of the inner wiring part 10. The outer wiring part 12 extends in the vertical direction so that an upper end portion thereof is joined to the wiring layer 3 to function as a grounding electrode, for example.

The outer wiring part 12 is formed from a position corresponding to the second insulation layer 2 from the uppermost insulation layer 2, on the top surface of which the circuit connection pads 5 are formed, down to a position corresponding to the lowermost insulation layer 2, for example.

Note that while there has been illustrated an example where the electronic component is disposed below the wiring board 1 and the circuit board is disposed above the wiring board, it may be configured to reverse the vertical orientation of the wiring board 1 so that the electronic component is disposed above the wiring board 1 and the circuit board is disposed below the wiring board.

The component connection pads 4 are joined by means of flip-chip connection to a terminal part of the electronic component not shown. An IC chip, an SDRAM (Synchronous Dynamic Random Access Memory) having a DDR (double data rate) mode, a memory, and a capacitor are employed as the electronic component, for example.

The circuit connection pads 5 of the wiring board 1 to which the electronic components 12 are mounted are joined by soldering or the like to a connection terminal of the circuit board not shown.

Therefore, the electronic component is electrically connected to each predetermined circuit formed on the circuit board through the component connection pads 4, the wiring layers 3, the vias 6, and the circuit connection pads 5. The electronic component is also electrically connected to a predetermined circuit formed on the circuit board through the component connection pad 4, the inner wiring part 10, and the circuit connection pad 5.

A space between the electronic component and the bottom surface of the wiring board 1 is filled with an underfill material (not shown) that covers the component connection pads 4. Moreover, a heat dissipation plate that is not shown is disposed on the bottom surface of the electronic component through a heat transfer material layer formed of a TIM (Thermal Interface Material) or the like so that heat generated in the electronic component is dissipated from the heat dissipation plate.

Note that the outer wiring part 12 may be formed from a position corresponding to the second insulation layer 2 from the lowermost insulation layer 2, in which the component connection pads 4 are formed, up to a position corresponding to the uppermost insulation layer 2, for example.

[Variation of Wiring Board]

Figure 2:
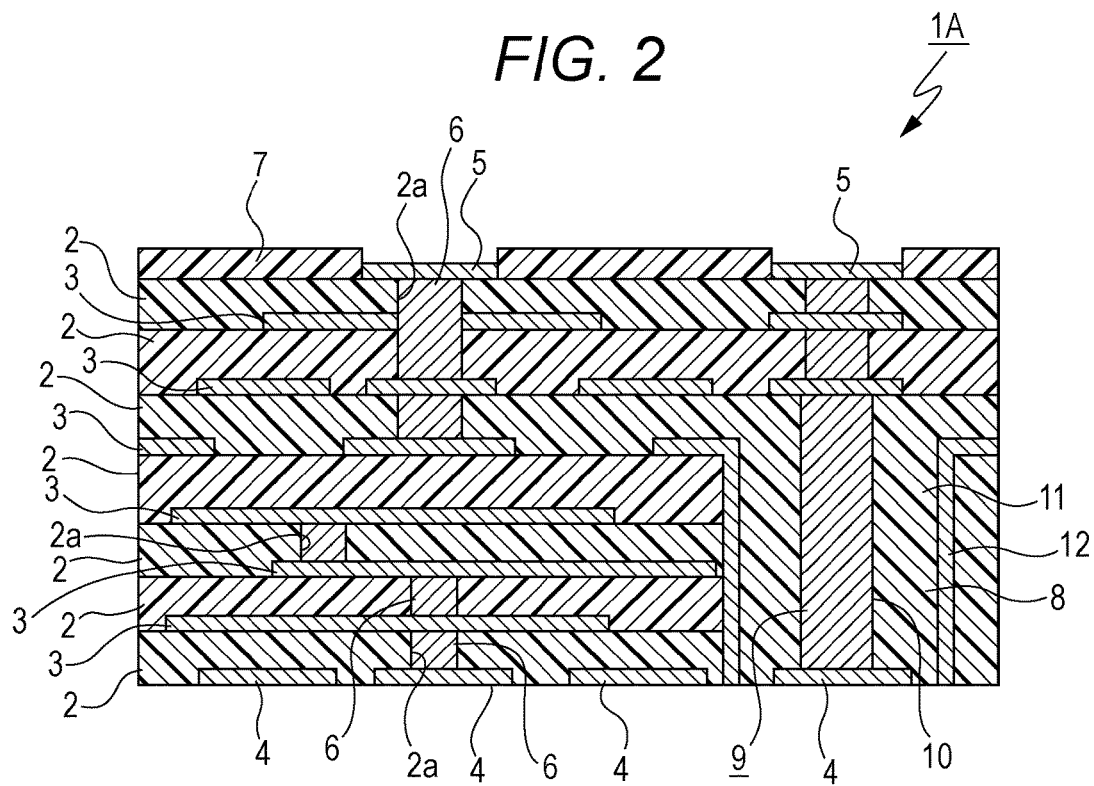
FIG. 2 is an enlarged cross sectional view of a wiring board according to a variation.

The variation of the wiring board will be described below (refer to FIG. 2).

Note that a wiring board 1A according to the variation illustrated below is different from the wiring board 1 described above in that a larger number of the insulation layers and wiring layers are provided and that the inner wiring part is connected to the component connection pad or the circuit connection pad through the wiring layer and the via. Accordingly, only a part of the wiring board 1A different from the wiring board 1 will be described in detail while the rest is assigned a reference numeral identical to that assigned to a similar part of the wiring board 1 and thus will not be described.

The wiring board 1A is a coreless board not including a core layer and includes a plurality of insulation layers 2 and a plurality of wiring layers 3 that are laminated alternately. The number of each of the insulation layers 2 and the wiring layers 3 is larger than the number of each of the insulation layers 2 and the plurality of wiring layers 3 of the wiring board 1.

An upper end of an inner wiring part 10 is joined to the wiring layer 3 while a lower end of the inner wiring part is joined to a component connection pad 4, for example. The upper end of the inner wiring part 10 is joined to the second wiring layer 3 from the top, for example, but may be joined to any of the wiring layers 3. The upper end of the inner wiring part 10 is connected to a circuit connection pad 5 through the wiring layers 3 and vias 6.

Note that the upper end of the inner wiring part 10 may be joined to the circuit connection pad 5 while the lower end of the inner wiring part may be joined to any of the wiring layers 3. In that case, the lower end of the inner wiring part 10 is connected to the component connection pad 4 through the wiring layers 3 and the vias 6.

An outer wiring part 12 is formed from a position corresponding to the third insulation layer 2 from the top to a position corresponding to the lowermost insulation layer 2, but may be formed from a position corresponding to any of the insulation layers 2 except the uppermost layer.

Note that the outer wiring part 12 may be formed from a position corresponding to any of the insulation layers 2 except the lowermost layer up to the position corresponding to the uppermost insulation layer 2, for example.

While there has been illustrated an example where an electronic component is disposed below the wiring board 1A and a circuit board is disposed above the wiring board, it may be configured to reverse the vertical orientation of the wiring board 1A so that the electronic component is disposed above the wiring board 1A and the circuit board is disposed below the wiring board.

[Dimension of Coaxial Structure]

The dimension of the coaxial structure 9 will be described below (refer to FIG. 3).

Figure 3:
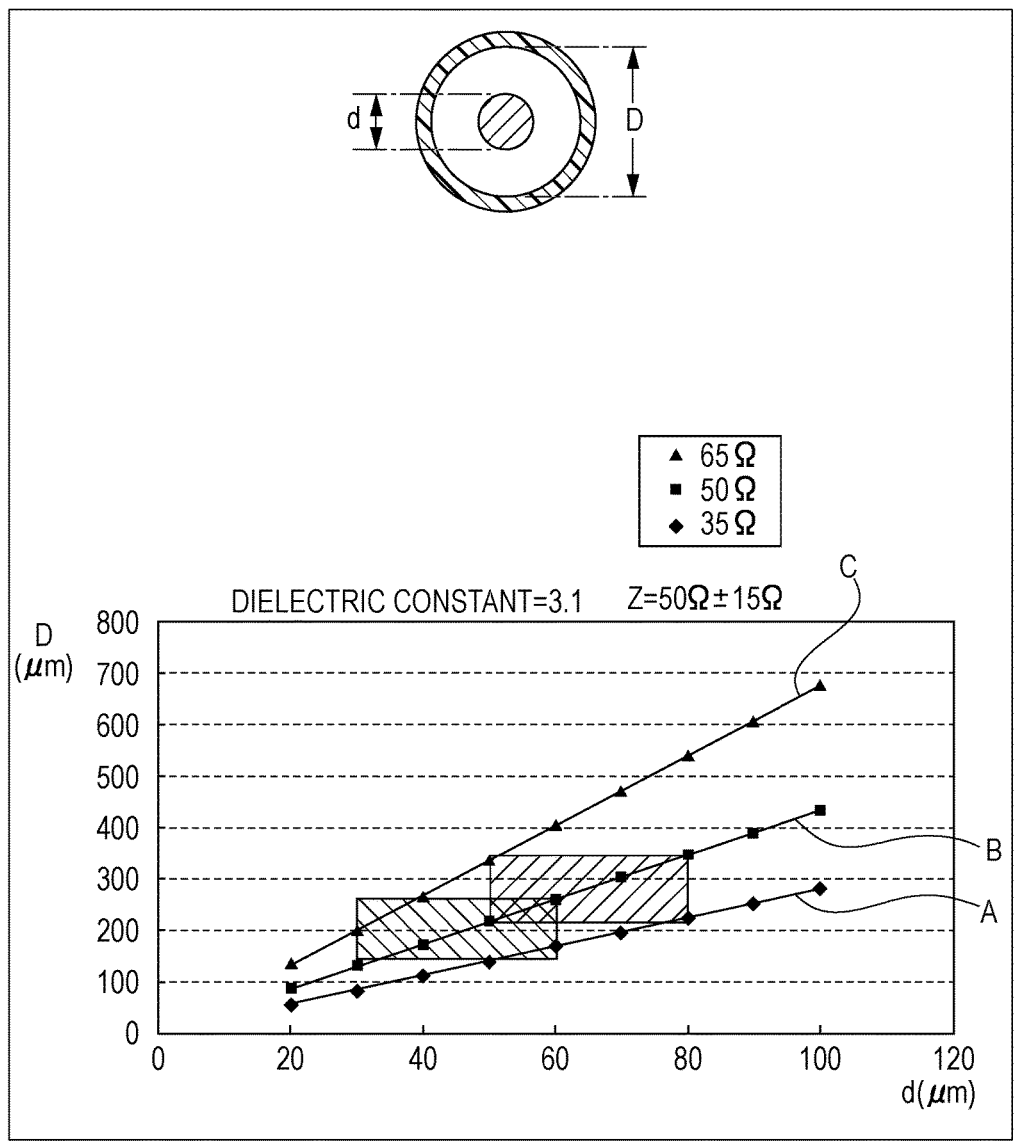
FIG. 3 is a graph illustrating a dimension of a coaxial structure.

In FIG. 3, a horizontal axis indicates an outer diameter d of the inner wiring part 10, while a vertical axis indicates an inner diameter D of the outer wiring part 12.

When the impedance in the coaxial structure 9 is to be set to 50Ω±15Ω as a proper value, the relationship between the outer diameter d of the inner wiring part 10 and the inner diameter D of the outer wiring part 12 desirably corresponds to graphs A, B, and C illustrated in FIG. 3, respectively. Note that a dielectric constant of the insulating resin 11 filled in the structure forming part 8 is set to 3.1.

Referring to the graphs A, B, and C illustrated in FIG. 3, it is desired that, in order to perform sufficient impedance control, the outer diameter d of the inner wiring part 10 be 30 μm or larger and 60 μm or smaller while the inner diameter D of the outer wiring part 12 be 130 μm or larger and 260 μm or smaller when the number of layers of the insulation layers 2 equals 7 or less, and the outer diameter d of the inner wiring part 10 be 50 μm or larger and 80 μm or smaller while the inner diameter D of the outer wiring part 12 be 200 μm or larger and 350 μm or smaller when the number of layers of the insulation layers 2 equals 5 or more and 12 or less.

Accordingly, it is desired that the relationship between the outer diameter d of the inner wiring part 10 and the inner diameter D of the outer wiring part 12 fall within the range indicated by diagonal lines in FIG. 3 (the outer diameter d: 30 μm or larger and 80 μm or smaller, and the inner diameter D: 130 μm or larger and 350 μm or smaller).

Where the outer diameter d of the inner wiring part 10 is set to 30 μm or larger and 80 μm or smaller while the inner diameter D of the outer wiring part 12 is set to 130 μm or larger and 350 μm or smaller, a value appropriate for performing sufficient impedance control is secured so that the impedance control can be performed satisfactorily on the wiring boards 1 and 1A even when there is a dimensional error in a design value caused by variation in position accuracy and processing accuracy of each part.

[Method of Manufacturing Wiring Board]

Next, a method of manufacturing the aforementioned wiring board 1 will be described (refer to FIGS. 4 to 12).

Figure 4:
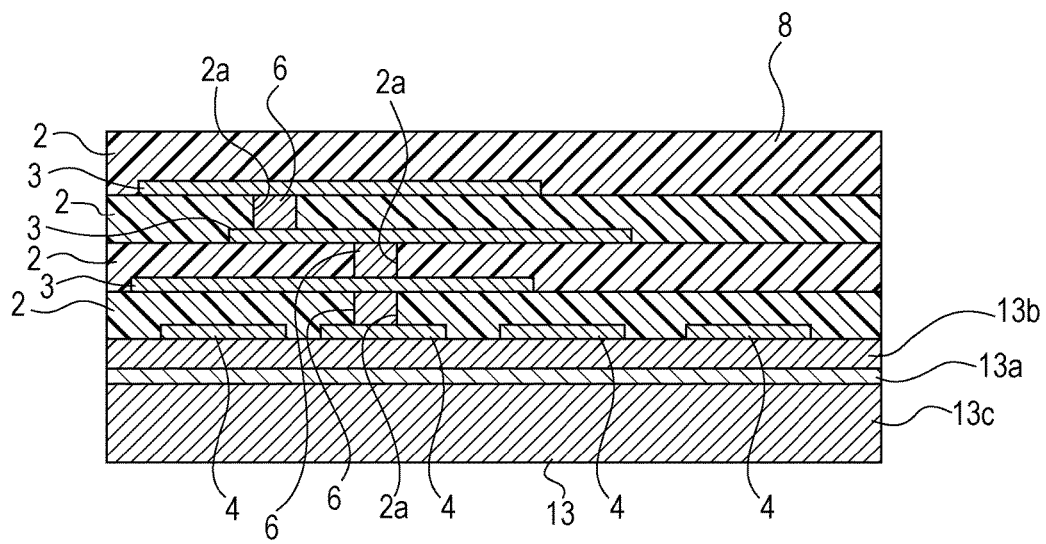
FIG. 4 illustrates the method of manufacturing a wiring board along with FIGS. 5 to 12, and is an enlarged cross sectional view illustrating a state where an insulation layer and a wiring layer are laminated alternately on a support while at the same time a structure forming part is provided.

A support 13 is prepared first, and then the plurality of insulation layers 2 and the plurality of wiring layers 3 are laminated on the support 13 (a lamination process) (refer to FIG. 4).

The support 13 is formed by vertically joining a first copper layer 13b and a second copper layer 13c while interposing a nickel layer 13a therebetween, for example.

The component connection pads 4 are formed on the bottom surface in the lamination process. Apart where the insulation layers 2 and the wiring layers 3 are not provided is formed and provided as the structure forming part 8. Note that the component connection pad 4 is formed on the bottom surface of the structure forming part 8.

Figure 5:
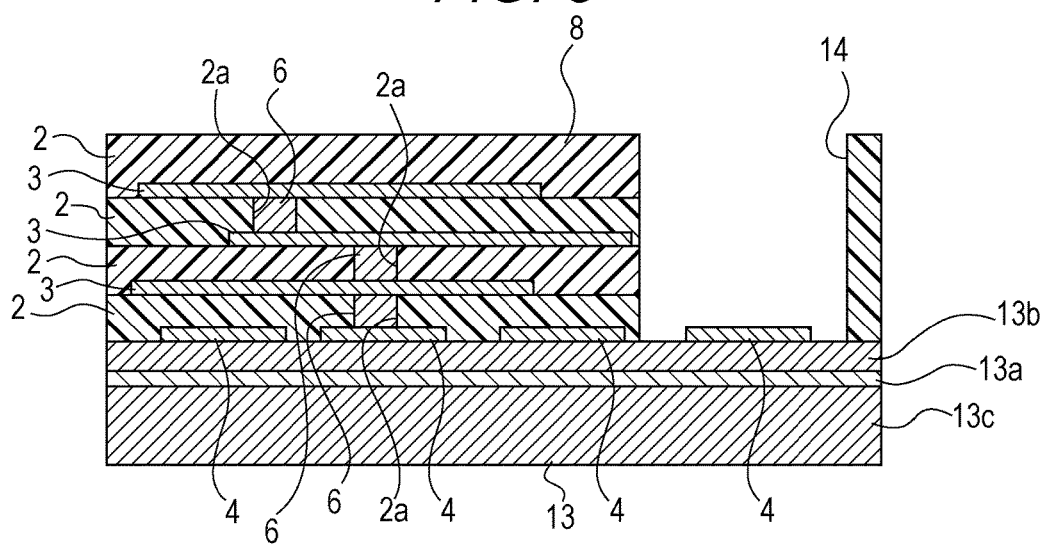
FIG. 5 is an enlarged cross sectional view illustrating a state where a structure forming through hole is formed.

Next, a structure forming through hole 14 for providing the coaxial structure 9 is formed by irradiating the structure forming part 8 with a laser beam (a first through hole formation process) (refer to FIG. 5). The diameter of the structure forming through hole 14 is formed in the size according to the size of the outer diameter of the outer wiring part 12 required.

Moreover, the structure forming through hole 14 is formed such that a central axis thereof corresponds with the center of the component connection pad 4 formed on the bottom surface of the structure forming part 8. When the central axis of the structure forming through hole 14 corresponds with the center of the component connection pad 4 formed on the bottom surface of the structure forming part 8 as described above, a central axis of the outer wiring part 12 formed in the structure forming part 8 can correspond with the center of the component connection pad 4 formed on the bottom surface of the structure forming part 8 to therefore improve the position accuracy of the outer wiring part 12.

The structure forming through hole 14 is formed by irradiation with the laser beam as described above, so that the surface of the support 13 need not be drilled like when the through hole is formed by a drill, a damage to the support 13 can be prevented, and the structure forming through hole 14 can be formed properly.

Figure 6:
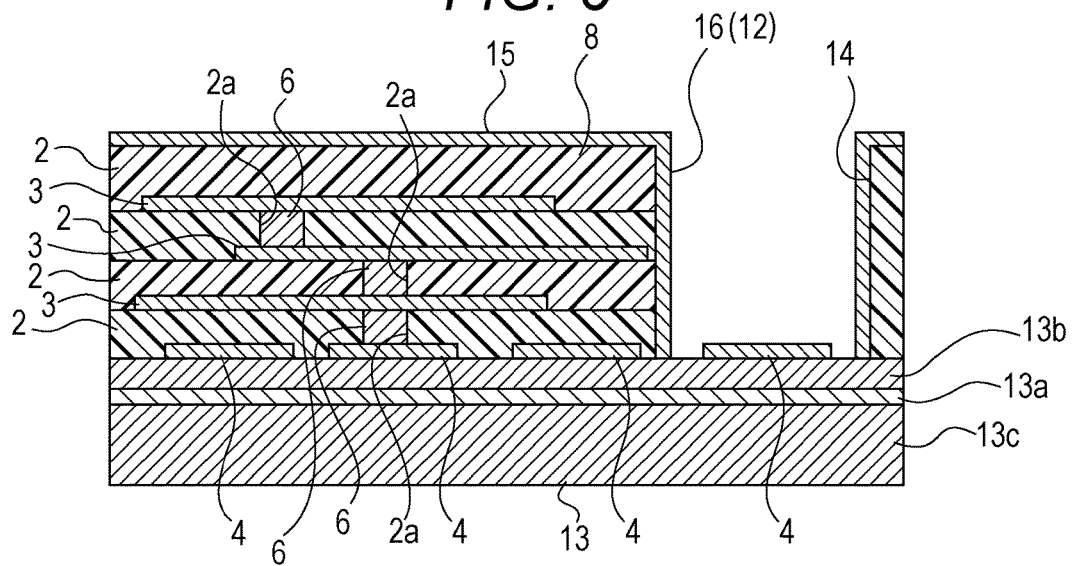
FIG. 6 is an enlarged cross sectional view illustrating a state where a conductive layer is formed on a top surface of the insulation layer and on a peripheral surface of the structure forming through hole.

Next, conductive layers (seed layers) 15 and 16 are formed on the top surface of the uppermost insulation layer 2 at this point and the peripheral surface of the structure forming through hole 14 by means of electroless plating of copper, for example (an outer wiring part formation process) (refer to FIG. 6). The conductive layer 16 formed on the peripheral surface of the structure forming through hole 14 is formed as the outer wiring part 12.

Figure 7:
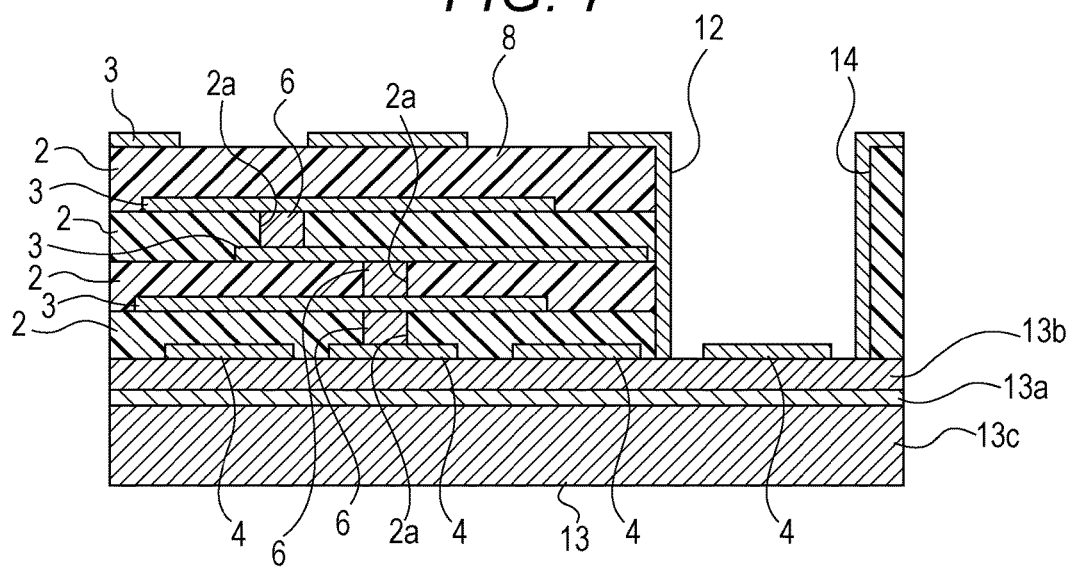
FIG. 7 is an enlarged cross sectional view illustrating a state where the conductive layer is patterned so that a part of the conductive layer is formed as a wiring layer.

The conductive layer 15 is thereafter subjected to patterning so that apart of the conductive layer 15 is formed as the wiring layer 3 by a semi-additive method, for example (refer to FIG. 7).

Figure 8:
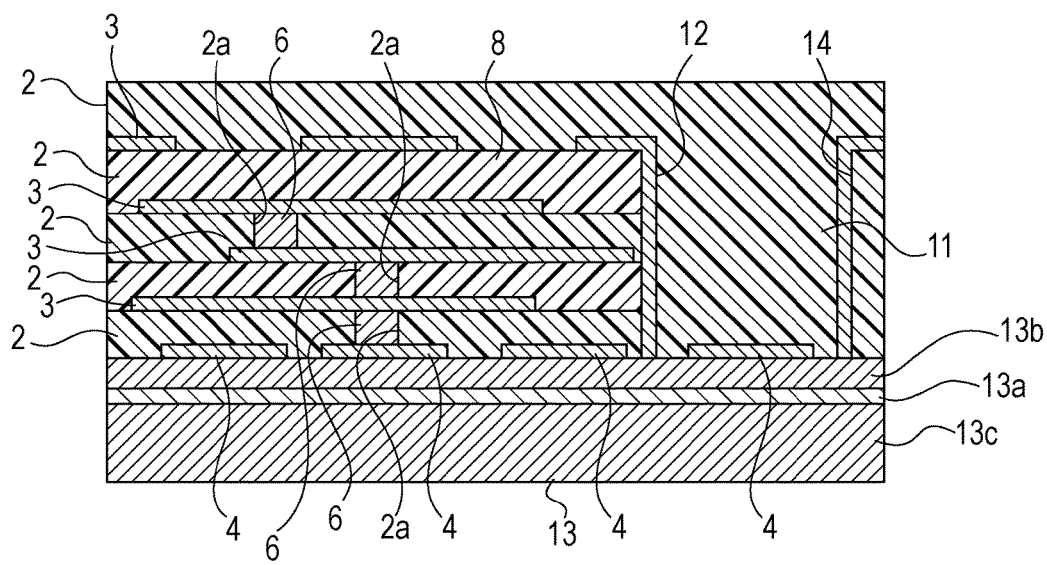
FIG. 8 is an enlarged cross sectional view illustrating a state where an insulating resin is laminated on the top surface of the insulation layer and fills the structure forming through hole.

Next, the insulating resin 11 is laminated on the top surface of the uppermost insulation layer 2 at this point and filled in the structure forming through hole 14 in which the outer wiring part 12 is formed (a resin filling process) (refer to FIG. 8). A highly fluid resin is employed as the insulating resin 11 where, for example, the base is the epoxy resin also used to form the insulation layers 2 but contains a component ensuring high fluidity.

The layer of the insulating resin 11 is provided as the uppermost insulation layer 2 by laminating the insulating resin 11 on the top surface of the provisional uppermost insulation layer 2.

Figure 9:
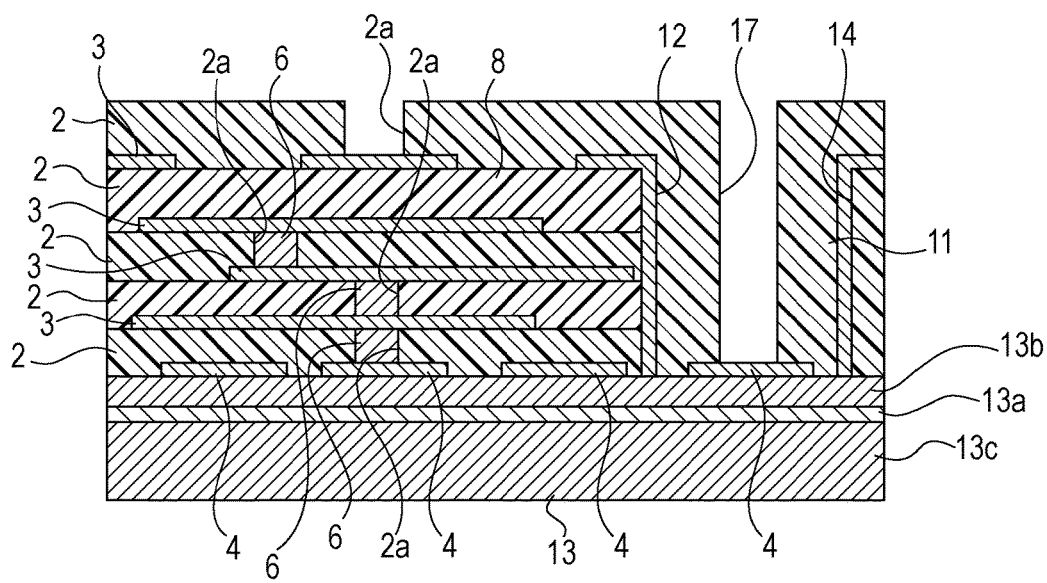
FIG. 9 is an enlarged cross sectional view illustrating a state where an inner wiring through hole is formed.

Subsequently, an inner wiring through hole 17 for providing the inner wiring part 10 is formed by irradiating the structure forming part 8 with a laser beam (a second through hole formation process) (refer to FIG. 9). The diameter of the inner wiring through hole 17 is formed in the size according to the size of the outer diameter of the inner wiring part 10 required. At this time, a via hole 2a is formed on a part of the uppermost insulation layer 2 (the insulating resin 11) by irradiation with a laser beam.

The inner wiring through hole 17 is formed such that a central axis thereof corresponds with the center of the component connection pad 4 formed on the bottom surface of the structure forming part 8. When the central axis of the inner wiring through hole 17 corresponds with the center of the component connection pad 4 formed on the bottom surface of the structure forming part 8 as described above, a central axis of the inner wiring part 10 formed in the structure forming part 8 can correspond with the center of the component connection pad 4 formed on the bottom surface of the structure forming part 8 as well as the central axis of the outer wiring part 12 to therefore improve the position accuracy of the inner wiring part 10.

Moreover, the inner wiring through hole 17 is formed by irradiation with the laser beam as described above, so that the surface of the component connection pad 4 need not be drilled like when the through hole is formed by a drill, a damage to the component connection pad 4 can be prevented, and the inner wiring through hole 17 can be formed properly.

Figure 10:
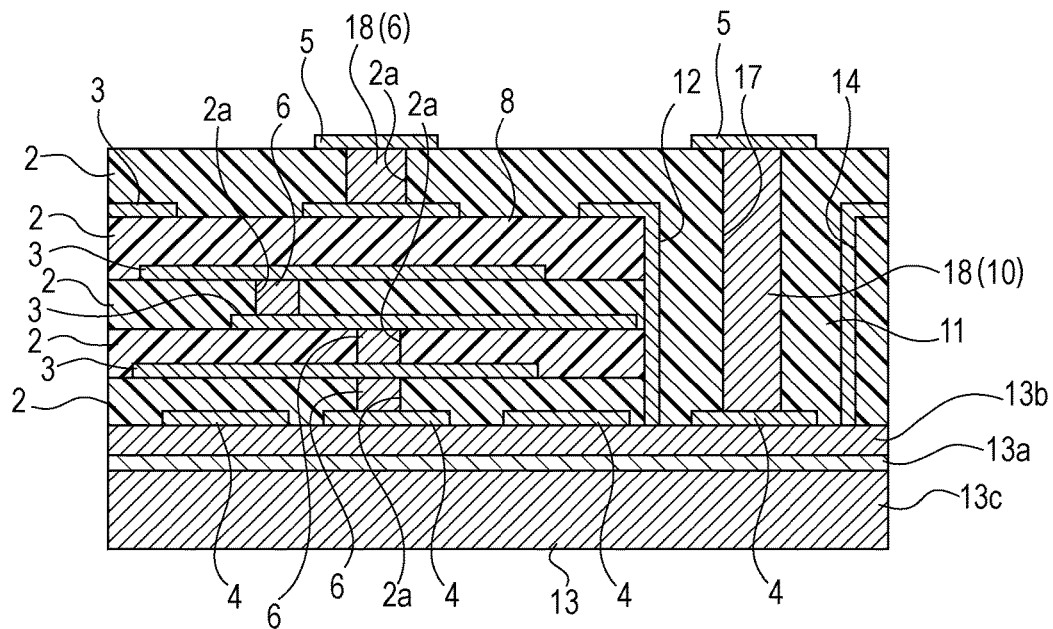
FIG. 10 is an enlarged cross sectional view illustrating a state where the inner wiring through hole is filled with a conductive material so that an inner wiring part is provided.

The inner wiring through hole 17 is filled with a conductive material 18, which is provided as the inner wiring part 10 (an inner wiring part formation process) (refer to FIG. 10).

At this time, the via hole 2a formed on the uppermost insulation layer 2 is filled with a conductive material to form the via 6. Moreover, the circuit connection pads 5 are formed on the top surface of the uppermost insulation layer 2 by copper plating and patterning, for example, and are joined to the top surface of each of the via 6 and the inner wiring part 10.

Figure 11:
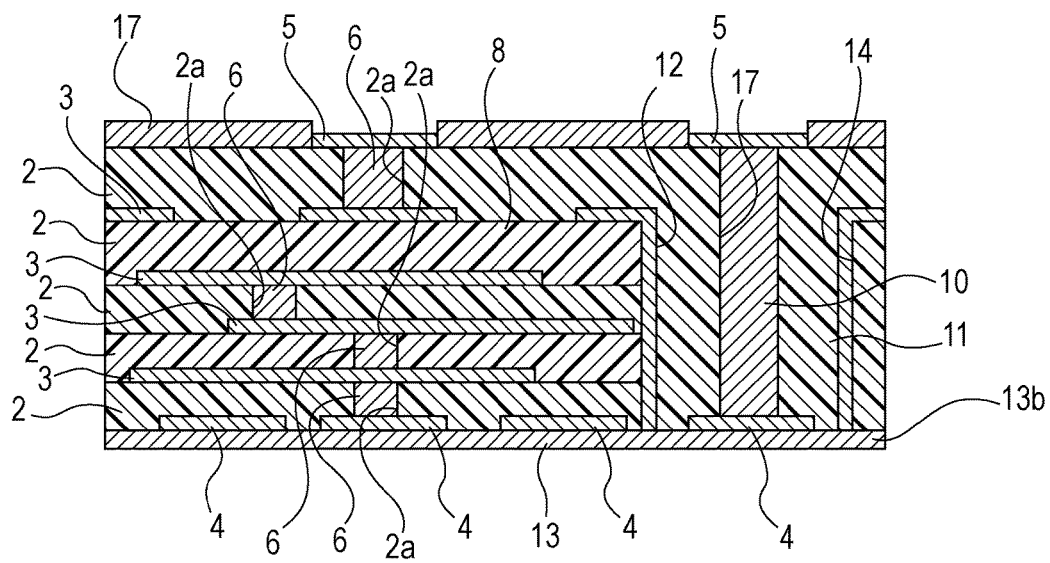
FIG. 11 is an enlarged cross sectional view illustrating a state where a portion of the support excluding a part thereof is peeled off while at the same time a solder resist is formed.

Next, a part of the support 13 excluding the first copper layer 13b is peeled off (refer to FIG. 11). The support 13 is formed of the first copper layer 13b and the second copper layer 13c that are vertically joined while interposing therebetween the nickel layer 13a, so that the nickel layer 13a and the second copper layer 13c can be easily peeled off from the first copper layer 13b, allowing one to realize improved workability in the peeling work. The thin first copper layer 13b remains by peeling off the nickel layer 13a and the second copper layer 13c from the first copper layer 13b.

At this time, the solder resist 7 is formed on a part of the top surface of the uppermost insulation layer 2 where the circuit connection pads 5 are not formed.

Figure 12:
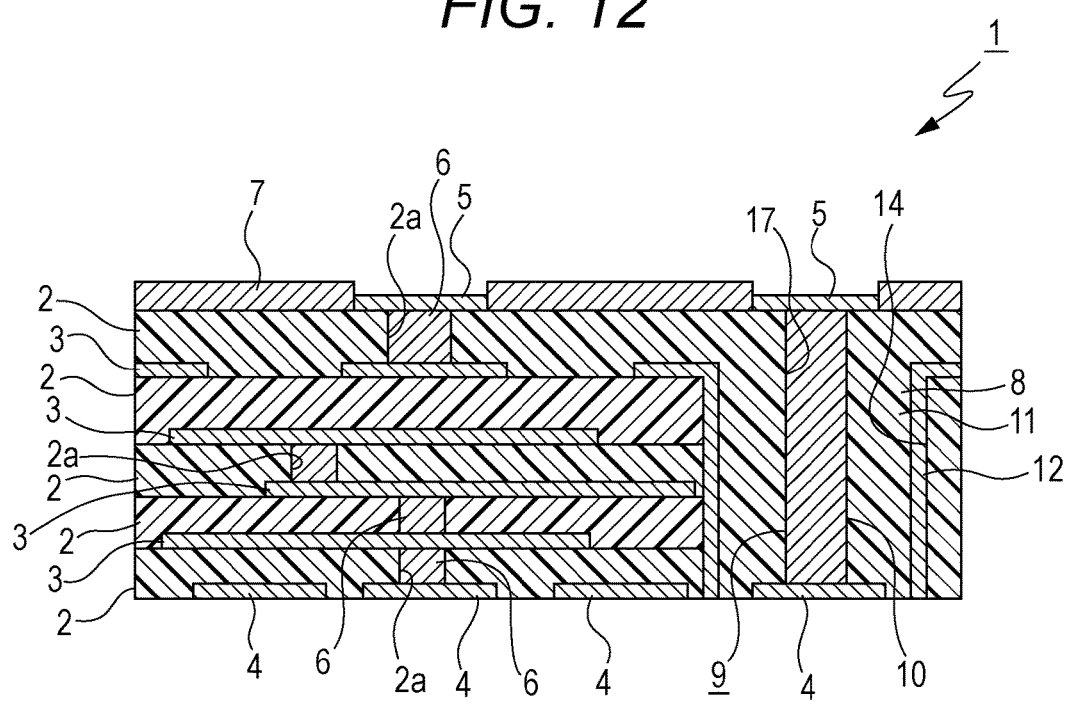
FIG. 12 is an enlarged cross sectional view illustrating a state where the remaining part of the support is peeled off.

Lastly, the first copper layer 13b is peeled off by etching (refer to FIG. 12).

Note that the wiring board 1 having the coaxial structure 9 is manufactured following, as needed, surface processing of the component connection pads 4 and the circuit connection pads 5, formation of pre-solder, and separation work by routing to obtain individual pieces.

Although not herein described in detail, a method of manufacturing the wiring board 1A according to the variation is adapted to manufacture the wiring board 1A by performing the aforementioned inner wiring part formation process, forming a predetermined number of layers of each of the insulation layer 2 and the wiring layer 3, and then performing the peeling work illustrated in FIG. 11 and onward.

[Summary]

In the wiring boards 1 and 1A, as described above, the coaxial structure 9 is provided in the structure forming part 8 where the inner wiring part 10 of the coaxial structure 9 extends in the lamination direction of the insulation layers 2 and the wiring layers 3 to be electrically connected to the component connection pad 4 and the circuit connection pad 5.

As a result, the accuracy of control related to the impedance is improved by the coaxial structure 9 so that the transmission loss of a signal can be mitigated upon securing the smaller size and higher density of the wiring boards 1 and 1A as well as the higher speed of operation.

As for the wiring board 1, both ends of the inner wiring part 10 are joined to each of the component connection pad 4 and the circuit connection pad 5 so that the coaxial structure 9 can be provided in the maximum size (length) with respect to the thickness of the wiring board 1 and that sufficient impedance control can be exerted.

As for the wiring board 1A, one end of the inner wiring part 10 is joined to one of the component connection pad 4 and the circuit connection pad 5 while another end of the inner wiring part 10 is connected to another one of the component connection pad 4 and the circuit connection pad 5 through the wiring layers 3 and the vias 6.

As a result, the coaxial structure 9 can be formed according to various modes having different layer structures to therefore realize increased versatility.

[Present Technology]

The present disclosure can also have the following configuration.

(1) A wiring board including: a plurality of insulation layers and a plurality of wiring layers which are laminated alternately; a component connection pad which is provided on one surface of the wiring board in a lamination direction of the insulation layers and the wiring layers, and to which an electronic component is connected; a circuit connection pad which is provided on another surface of the wiring board in the lamination direction and is connected to a circuit board; and a structure forming part which partly includes a coaxial structure, wherein each of the wiring layers is connected by a via, the coaxial structure includes an inner wiring part extending in the lamination direction and an outer wiring part located on a side corresponding to an outer peripheral surface of the inner wiring part through an insulating resin, and the inner wiring part is electrically connected to the component connection pad and the circuit connection pad.

(2) The wiring board according to (1), wherein both ends of the inner wiring part in the lamination direction are joined to each of the component connection pad and the circuit connection pad.

(3) The wiring board according to (1), wherein one end of the inner wiring part in the lamination direction is joined to one of the component connection pad and the circuit connection pad while another end of the inner wiring part in the lamination direction is connected to another one of the component connection pad and the circuit connection pad through the wiring layer and the via.

(4) The wiring board according to any of (1) to (3), wherein an outer diameter of the inner wiring part is 30 μm or larger and 80 μm or smaller while an inner diameter of the outer wiring part is 130 μm or larger and 350 μm or smaller.

(5) A method of manufacturing a wiring board including: a lamination process of laminating a plurality of insulation layers and a plurality of wiring layers on a support; a first through hole formation process of forming a structure forming through hole to partly provide a coaxial structure; an outer wiring part formation process of forming an outer wiring part which configures a part of the coaxial structure inside the structure through hole; a resin filling process of filling at least the structure forming through hole with resin; a second through hole formation process of forming an inner wiring through hole provided to form, in the resin filling the structure forming through hole, an inner wiring part which configures a part of the coaxial structure while electrically connected to a component connection pad, to which an electronic component is connected, and a circuit connection pad connected to a circuit board; and an inner wiring part formation process of forming the inner wiring part by filling the inner wiring through hole with a conductive material.

(6) The method of manufacturing a wiring board according to (5), wherein the structure forming through hole is formed by irradiation with a laser beam.

(7) The method of manufacturing a wiring board according to (5) or (6), wherein the inner wiring part forming through hole is formed by irradiation with a laser beam.

(8) The method of manufacturing a wiring board according to any of (5) to (7), wherein a component connection pad to which an electronic component is connected is provided on one surface of the board in a lamination direction of the insulation layer and the wiring layer, a circuit connection pad connected to a circuit board is provided on another surface of the board in the lamination direction, and both ends of the inner wiring part in the lamination direction are joined to each of the component connection pad and the circuit connection pad.

(9) The method of manufacturing a wiring board according to any of (5) to (7), wherein a component connection pad to which an electronic component is connected is provided on one surface of the board in the lamination direction, a circuit connection pad connected to a circuit board is provided on another surface of the board in the lamination direction, one end of the inner wiring part in the lamination direction is joined to one of the component connection pad and the circuit connection pad, and another end of the inner wiring part in the lamination direction is connected to another one of the component connection pad and the circuit connection pad through the wiring layer and the via.

(10) The method of manufacturing a wiring board according to any of (5) to (9), wherein an outer diameter of the inner wiring part is 30 μm or larger and 80 μm or smaller while an inner diameter of the outer wiring part is 130 μm or larger and 350 μm or smaller.

The specific forms and structures of each part illustrated in the best modes for carrying out the aforementioned technology are illustrated merely as an example in realizing the present technology, where the technical scope of the present technology is not to be interpreted in a limited manner by these forms and structures.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST

1 Wiring board
2 Insulation layer
3 Wiring layer
4 Component connection pad
5 Circuit connection pad
6 Via
8 Structure forming part
9 Coaxial structure
10 Inner wiring part
11 Insulating resin
12 Outer wiring part
13 Support
14 Structure forming through hole
17 Inner wiring through hole

The invention claimed is:

1. A wiring board, comprising:
a plurality of insulation layers and a plurality of wiring layers which are laminated alternately,
wherein a first wiring layer of the plurality of wiring layers is in contact with both a first insulation layer of the plurality of insulation layers and a second insulation layer of the plurality of insulation layers;
a component connection pad on a first surface of the wiring board,
wherein the component connection pad is in a lamination direction of the plurality of insulation layers and the plurality of wiring layers, and
wherein the component connection pad is connected to an electronic component;
a circuit connection pad on a second surface of the wiring board in the lamination direction,
wherein the circuit connection pad is connectable to a circuit board, and
wherein the first wiring layer of the plurality of wiring layers is connected to a second wiring layer of the plurality of wiring layers by a via; and
a coaxial structure that includes an inner wiring part, an outer wiring part and an insulating resin,
wherein the wiring board includes a first part and a second part different from the first part, wherein the first part includes the plurality of insulation layers and the plurality of wiring layers, wherein the coaxial structure is in the second part of the wiring board,
wherein the inner wiring part extends in the lamination direction, the outer wiring part is on a side corresponding to an outer peripheral surface of the inner wiring part, and the insulating resin is between the inner wiring part and the outer wiring part, and
wherein the inner wiring part is electrically connected to the component connection pad and the circuit connection pad.

2. The wiring board according to claim 1,
wherein a first end of the inner wiring part is joined to the component connection pad, and
wherein a second end of the inner wiring part is joined to the circuit connection pad.

3. The wiring board according to claim 1, wherein a first end of the inner wiring part is joined to the component connection pad and a second end of the inner wiring part is connected to the circuit connection pad.

4. The wiring board according to claim 1, wherein an outer diameter of the inner wiring part is in a range of 30 μm to 80 μm, and an inner diameter of the outer wiring part is in a range of 130 μm to 350 μm.

5. The wiring board according to claim 1, wherein the second wiring layer of the plurality of wiring layers is in contact with both a third insulation layer of the plurality of insulation layers and the second insulation layer of the plurality of insulation layers.

6. A method of manufacturing a wiring board, the method comprising:
laminating a plurality of insulation layers and a plurality of wiring layers on a support,
wherein a first wiring layer of the plurality of wiring layers is laminated in contact with both a first insulation layer of the plurality of insulation layers and a second insulation layer of the plurality of insulation layers, and
wherein the first wiring layer of the plurality of wiring layers is connected to a second wiring layer of the plurality of wiring layers by a via;
forming a through hole in a part of the wiring board,
wherein the through hole is separated from the plurality of wiring layers and the plurality of insulation layers,
wherein the through hole partly includes a coaxial structure,
wherein the wiring board includes a first part and a second part different from the first part, wherein the first part includes the plurality of insulation layers and the plurality of wiring layers, and wherein the coaxial structure is in the second part of the wiring board;
forming an outer wiring part as a first part of the coaxial structure inside the through hole;
filling the through hole with resin;
forming an inner wiring through hole, in the resin, for an inner wiring part,
wherein the inner wiring part is a second part of the coaxial structure,
wherein the inner wiring part is electrically connected to a component connection pad and a circuit connection pad, and
wherein the component connection pad is connected to an electronic component, and the circuit connection pad is connected to a circuit board; and
filling the inner wiring through hole with a conductive material to form the inner wiring part.

7. The method of manufacturing according to claim 6, wherein the through hole is formed by irradiation with a laser beam.

8. The method of manufacturing according to claim 6, wherein the inner wiring through hole is formed by irradiation with a laser beam.

9. The method of manufacturing according to claim 6, wherein
the component connection pad is on a first surface of the wiring board,
the component connection pad is in a lamination direction of the plurality of insulation layers and the plurality of wiring layers,
the circuit connection pad is on a second surface of the wiring board in the lamination direction, and
a first end of the inner wiring part is joined to the component connection pad, and
a second end of the inner wiring part is joined to the circuit connection pad.

10. The method of manufacturing according to claim 6, wherein
the component connection pad is on a first surface of the wiring board,
the component connection pad is in a lamination direction of the plurality of insulation layers and the plurality of wiring layers,
the circuit connection pad is on a second surface of the wiring board in the lamination direction,
a first end of the inner wiring part, in the lamination direction, is joined to the component connection pad, and
a second end of the inner wiring part, in the lamination direction, is connected to the circuit connection pad.

11. The method of manufacturing according to claim 6, wherein an outer diameter of the inner wiring part is in a range of 30 μm to 80 μm, and an inner diameter of the outer wiring part is in a range of 130 μm to 350 μm.

* * * * *